(12) United States Patent
Yang

(10) Patent No.: US 11,252,829 B2
(45) Date of Patent: Feb. 15, 2022

(54) ELECTRONIC DEVICE

(71) Applicant: QISDA CORPORATION, Taoyuan (TW)

(72) Inventor: Hsueh-Chun Yang, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 0 days.

(21) Appl. No.: 17/113,125

(22) Filed: Dec. 7, 2020

(65) Prior Publication Data
US 2021/0185838 A1    Jun. 17, 2021

(30) Foreign Application Priority Data

Dec. 13, 2019 (CN) .......................... 201911283820.5

(51) Int. Cl.
| | |
|---|---|
| H05K 1/18 | (2006.01) |
| H05K 5/02 | (2006.01) |
| H05K 7/14 | (2006.01) |
| H05K 1/02 | (2006.01) |
| H05K 1/14 | (2006.01) |
| H05K 5/00 | (2006.01) |

(52) U.S. Cl.
CPC ......... *H05K 5/0208* (2013.01); *H05K 1/0275* (2013.01); *H05K 1/0277* (2013.01); *H05K 1/14* (2013.01); *H05K 1/18* (2013.01); *H05K 5/0017* (2013.01); *H05K 7/1427* (2013.01); *H05K 2201/10159* (2013.01)

(58) Field of Classification Search
CPC .. H05K 5/0208; H05K 1/0275; H05K 1/0277; H05K 1/14; H05K 1/18; H05K 5/0017; H05K 7/1427; H05K 2201/10159
USPC ........................................................ 361/749
See application file for complete search history.

(56) References Cited

U.S. PATENT DOCUMENTS

| | | | |
|---|---|---|---|
| 2014/0375300 A1* | 12/2014 | Tanaka .................... | G06F 1/185 324/76.11 |
| 2016/0042188 A1* | 2/2016 | Nasserbakht .......... | B21D 39/00 726/3 |
| 2018/0228386 A1* | 8/2018 | McCall .............. | A61B 5/02156 |

* cited by examiner

*Primary Examiner* — Binh B Tran

(57) ABSTRACT

An electronic device includes a casing, a main circuit board, a detachable component and a flexible circuit board. The main circuit board is disposed in the casing. The main circuit board includes a processor and a memory, wherein the memory stores data. The detachable component is disposed in the casing. The flexible circuit board includes a first end portion, a second end portion, a middle portion and a first detection loop, wherein the first detection loop is disposed at the first end portion and the middle portion. The first end portion is electrically connected to the main circuit board and the second end portion is fixed on the detachable component. When the detachable component is detached from the casing, the middle portion breaks, such that the first detection loop is cut off. When the first detection loop is cut off, the processor erases the data stored in the memory.

7 Claims, 8 Drawing Sheets

ELECTRONIC DEVICE

BACKGROUND OF THE INVENTION

1. Field of the Invention

The invention relates to an electronic device and, more particularly, to an electronic device capable of preventing data from being stolen.

2. Description of the Prior Art

As technology advances and develops, various electronic devices (e.g. mobile phone, tablet computer, etc.) are considered a necessity by a lot of people in their daily lives. Accordingly, people often store personal data in the electronic device for various applications (e.g. electronic payment). When the electronic device is stolen, the personal data stored in the electronic device may be stolen, such that personal privacy and safety will be invaded.

SUMMARY OF THE INVENTION

An objective of the invention is to provide an electronic device capable of preventing data from being stolen, so as to solve the aforesaid problems.

According to an embodiment of the invention, an electronic device comprises a casing, a main circuit board, a detachable component and a flexible circuit board. The main circuit board is disposed in the casing. The main circuit board comprises a processor and a memory, wherein the memory stores data. The detachable component is disposed in the casing. The flexible circuit board comprises a first end portion, a second end portion, a middle portion and a first detection loop, wherein the middle portion is located between the first end portion and the second end portion, and the first detection loop is disposed at the first end portion and the middle portion. The first end portion is electrically connected to the main circuit board and the second end portion is fixed on the detachable component. When the detachable component is detached from the casing, the middle portion breaks, such that the first detection loop is cut off. When the first detection loop is cut off, the processor erases the data stored in the memory.

As mentioned in the above, the invention connects the first end portion of the flexible circuit board to the main circuit board and fixes the second end portion of the flexible circuit board on the detachable component. When the detachable component is detached from the casing, the middle portion of the flexible circuit board breaks, such that the first detection loop is cut off. At this time, the processor erases the data stored in the memory. Accordingly, when the electronic device is stolen, the invention can prevent the data stored in the electronic device from being stolen effectively.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
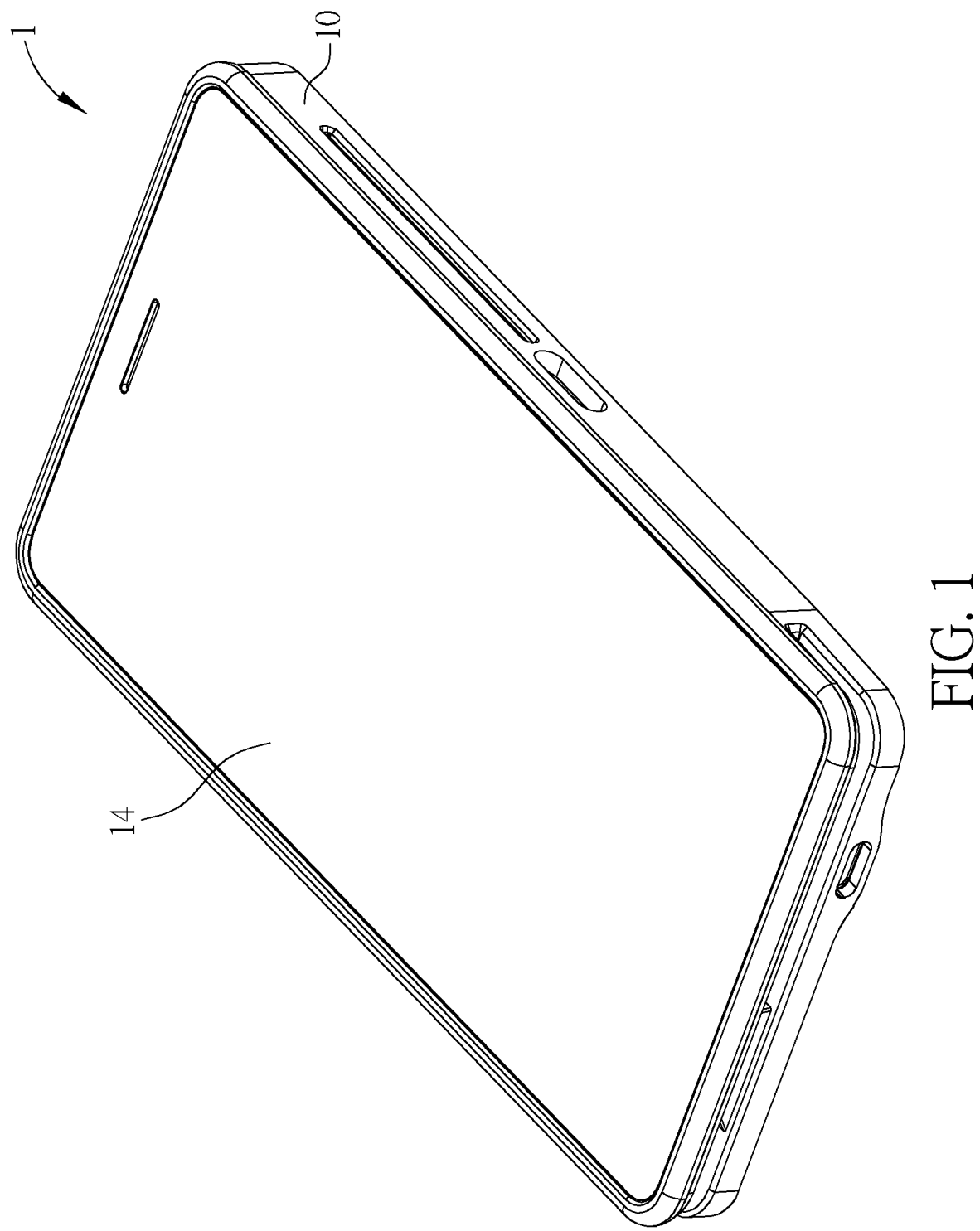
FIG. 1 is a perspective view illustrating an electronic device according to an embodiment of the invention.
Figure 2:
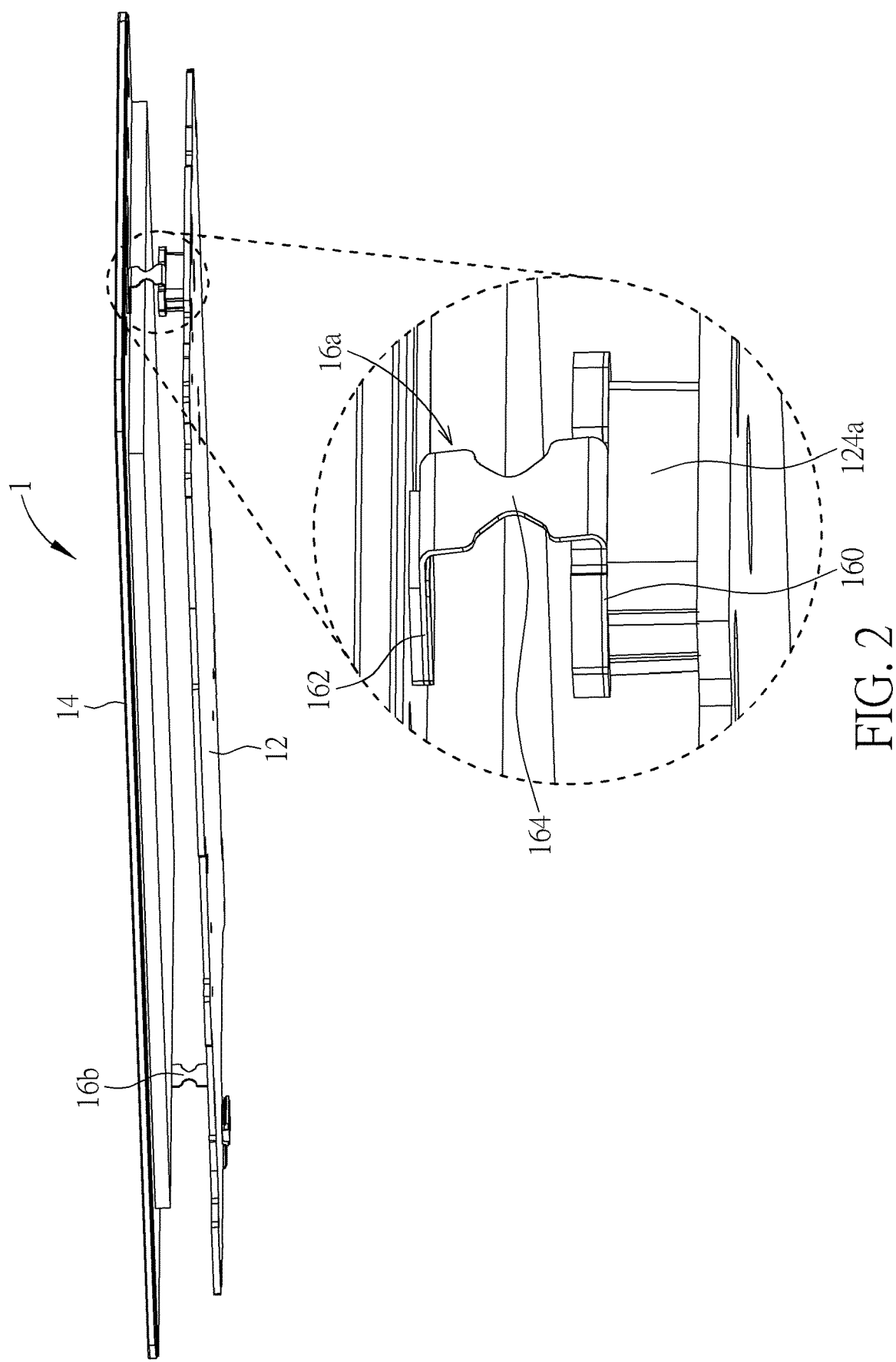
FIG. 2 is a perspective view illustrating the electronic device shown in FIG. 1 after removing the casing.
Figure 3:
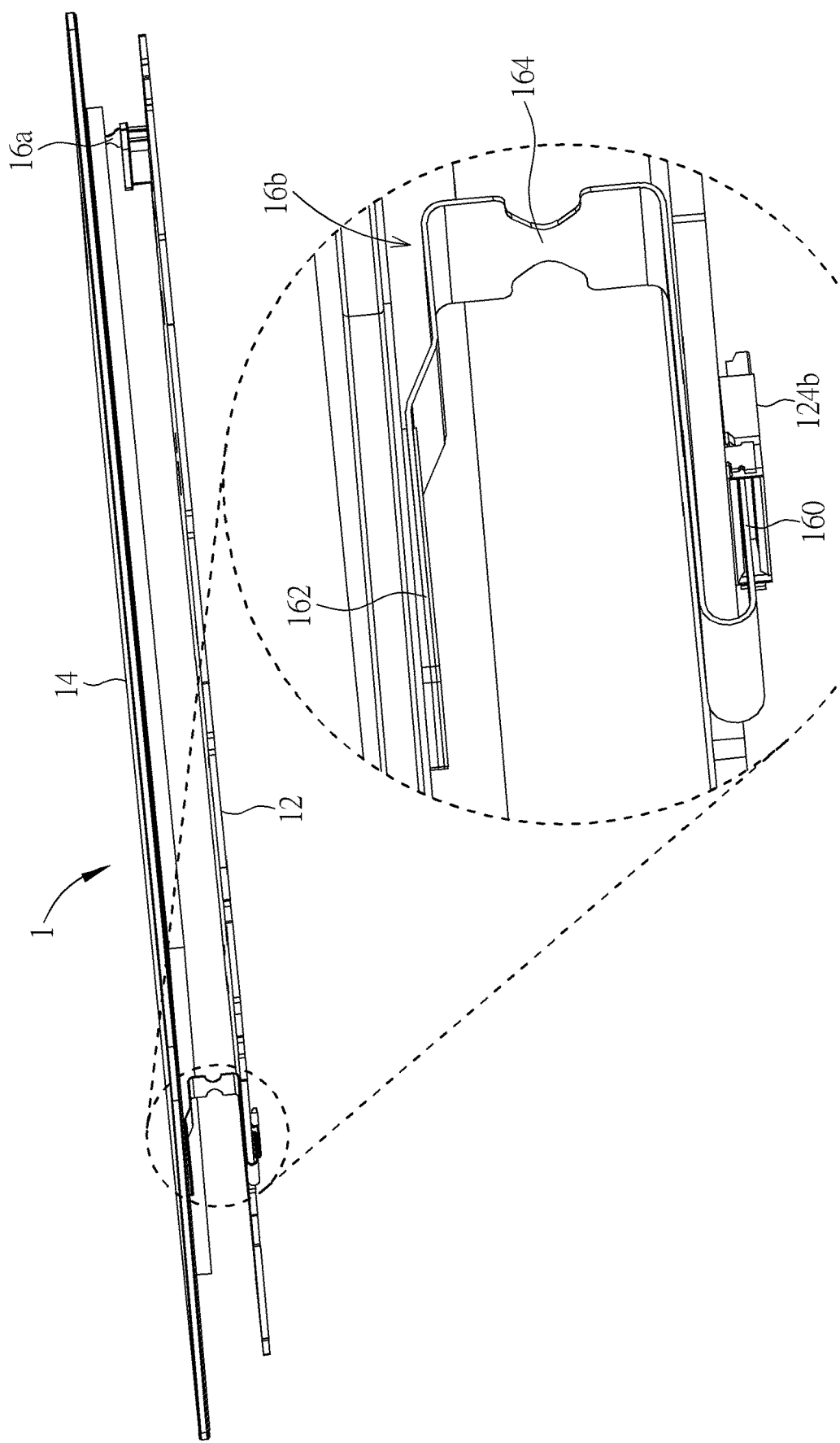
FIG. 3 is a perspective view illustrating the electronic device shown in FIG. 1 from another viewing angle after removing the casing.
Figure 4:
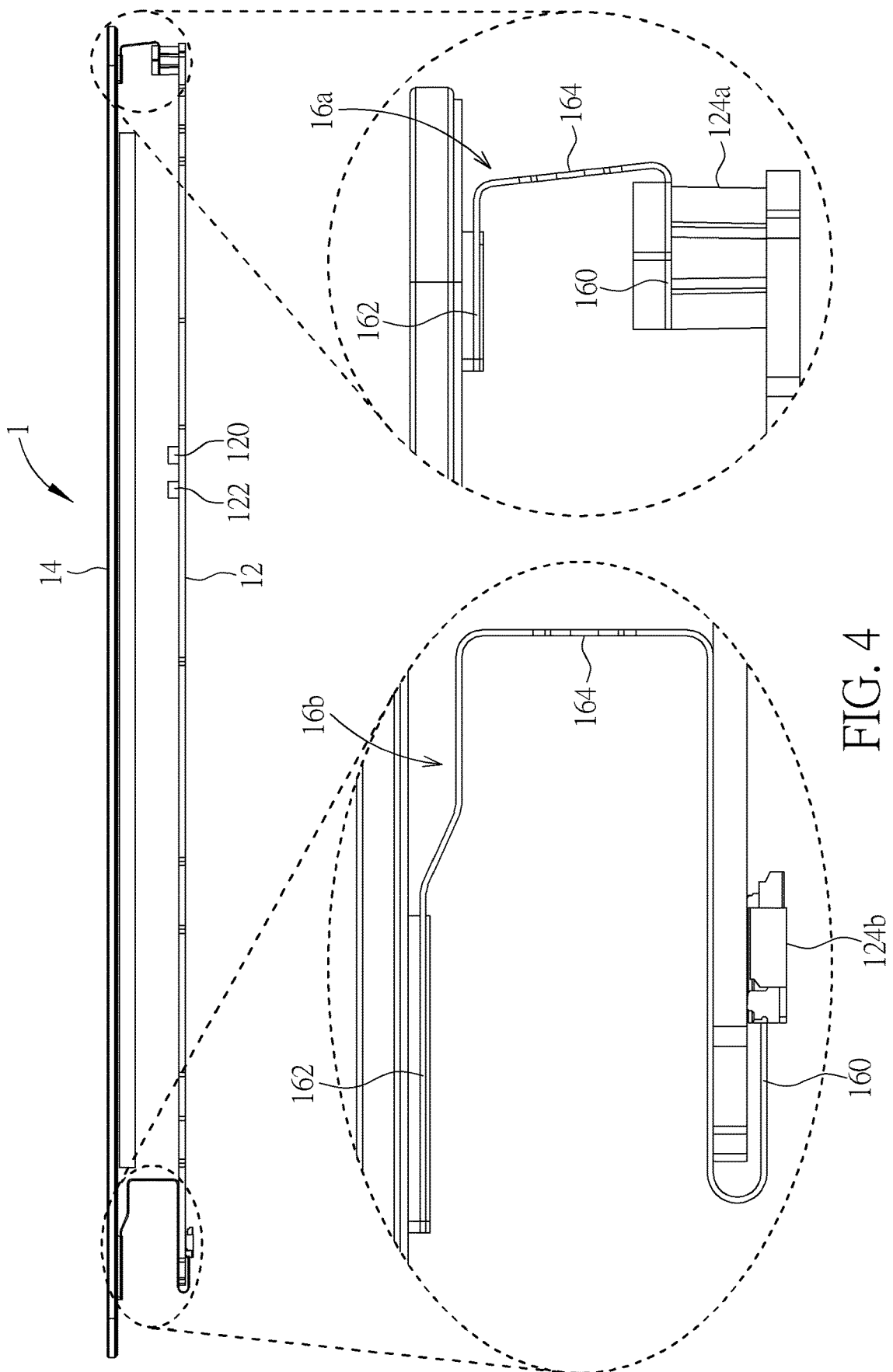
FIG. 4 is a side view illustrating the electronic device 1 shown in FIG. 1 after removing the casing.
Figure 5:
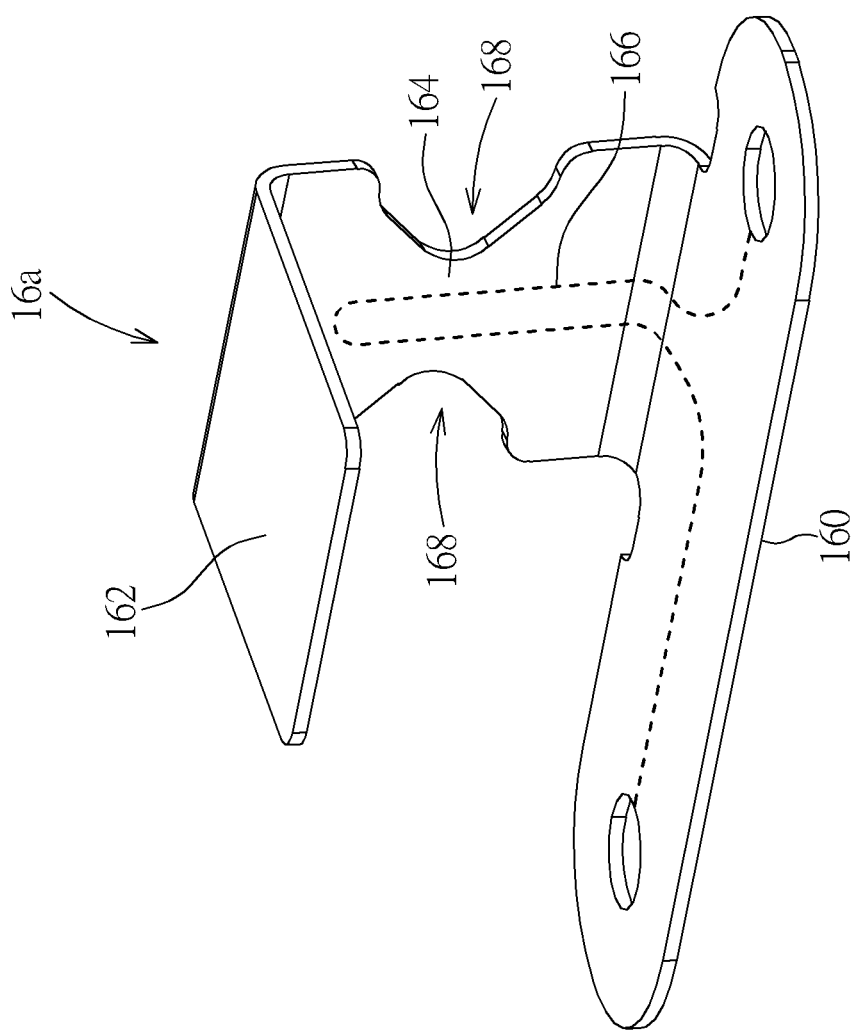
FIG. 5 is a perspective view illustrating the flexible circuit board shown in FIG. 4.
Figure 6:
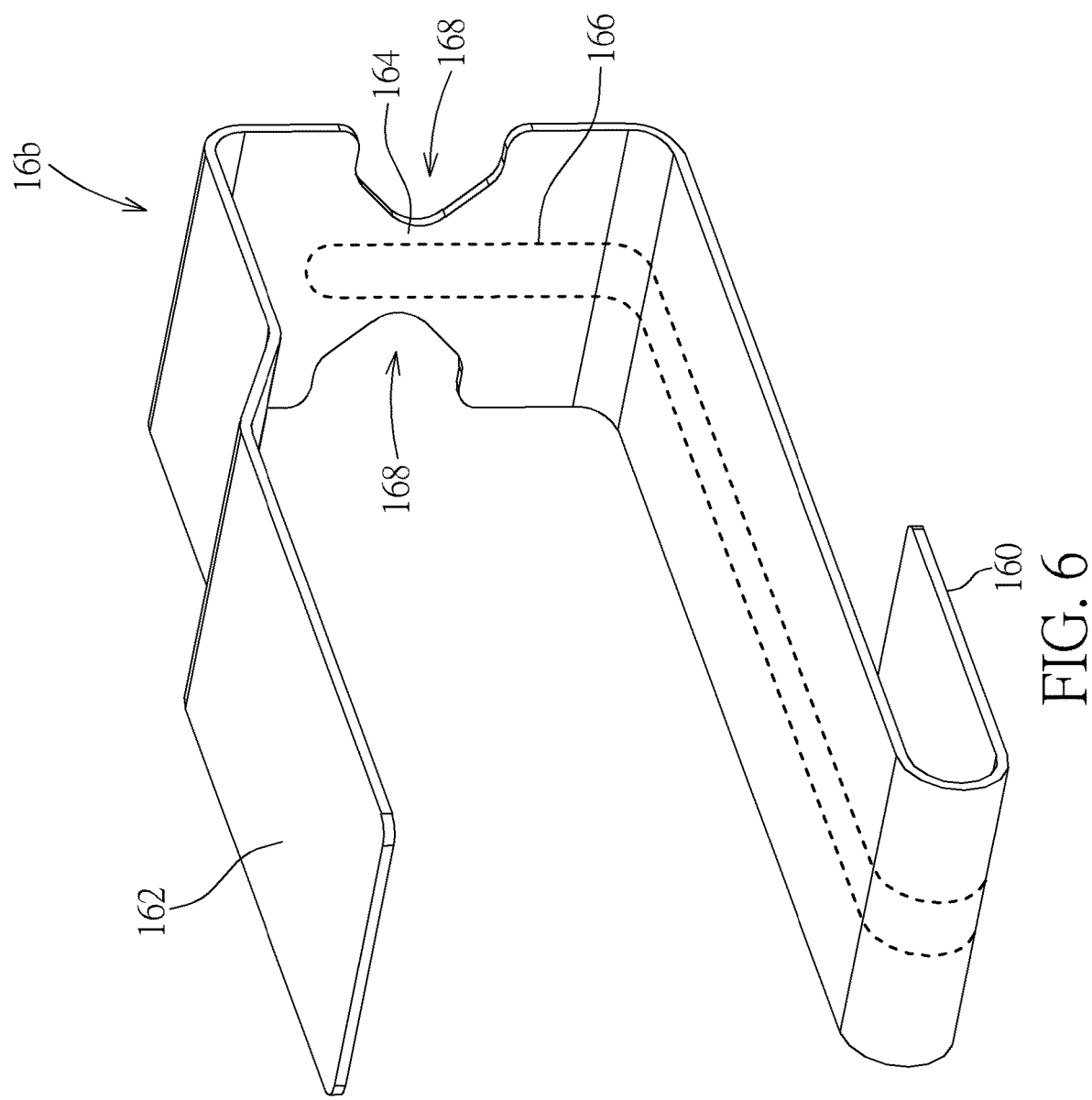
FIG. 6 is a perspective view illustrating the flexible circuit board 166 shown in FIG. 4.

Referring to FIGS. 1 to 6, FIG. 1 is a perspective view illustrating an electronic device 1 according to an embodiment of the invention, FIG. 2 is a perspective view illustrating the electronic device 1 shown in FIG. 1 after removing the casing 10, FIG. 3 is a perspective view illustrating the electronic device 1 shown in FIG. 1 from another viewing angle after removing the casing 10, FIG. 4 is a side view illustrating the electronic device 1 shown in FIG. 1 after removing the casing 10, FIG. 5 is a perspective view illustrating the flexible circuit board 16a shown in FIG. 4, and FIG. 6 is a perspective view illustrating the flexible circuit board 166 shown in FIG. 4.

As shown in FIGS. 1 to 4, the electronic device 1 comprises a casing 10, a main circuit board 12, a detachable component 14 and two flexible circuit boards 16a, 16b. In this embodiment, the detachable component 14 may be, but not limited to, a touch panel. In practical applications, the detachable component 14 may be any detachable component disposed in the electronic device 1. Furthermore, the electronic device 1 may be a mobile phone, a tablet computer, a notebook computer or other electronic devices according to practical applications. In general, the electronic device 1 may be further equipped with some necessary hardware or software components for specific purposes, such as an input/output port, applications, a power supply, a communication module, etc., and it depends on practical applications.

The main circuit board 12, the detachable component 14 and the flexible circuit boards 16a, 16b are disposed in the casing 10. As shown in FIG. 4, the main circuit board 12 comprises a processor 120 and a memory 122, wherein the memory 122 stores data. It should be noted that the data stored in the memory 122 may be any data (e.g. text, image, video, etc.) of any format according to practical applications.

As shown in FIGS. 5 to 6, each of the flexible circuit boards 16a, 16b comprises a first end portion 160, a second end portion 162, a middle portion 164 and a first detection loop 166, wherein the middle portion 164 is located between the first end portion 160 and the second end portion 162, and the first detection loop 166 is disposed at the first end portion 160 and the middle portion 164. In this embodiment, two holes 168 may be formed on opposite sides of the middle portion 164, such that the first end portion 160, the second end portion 162 and the middle portion 164 form an H-shape. In other words, a width of the middle portion 164 is smaller than a width of the first end portion 160 and smaller than a width of the second end portion 162. Preferably, the width of the middle portion 164 may be between 1 mm and 2 mm, such that the wide of the middle portion 164 is enough for accommodating the first detection loop 166 and the middle portion 164 may break easily as the first end portion 160 and/or the second end portion 162 is pulled by an external force.

As shown in FIGS. 2 to 4, the first end portion 160 of each of the flexible circuit boards 16a, 16b is electrically connected to the main circuit board 12 and the second end portion 162 of each of the flexible circuit boards 16a, 16b is fixed on the detachable component 14. In this embodiment, the first end portions 160 of the flexible circuit boards 16a, 16b may be connected to electronic components 124a, 124b (e.g. electrical connectors) of the main circuit board 12, such that the first end portions 160 are electrically connected to the main circuit board 12 through the electronic components 124a, 124b. In another embodiment, the first end portions 160 of the flexible circuit boards 16a, 16b may also be directly connected to electrical pads of the main circuit board 12 according to practical applications. In this embodiment, the second end portions 162 of the flexible circuit boards 16a, 16b may be fixed on the detachable component 14 by adhesive, but is not so limited. In another embodiment, the second end portions 162 of the flexible circuit boards 16a, 16b may also be fixed on the detachable component 14 by other fixing manners according to practical applications.

In this embodiment, the flexible circuit boards 16a, 16b may be disposed at opposite sides within the casing 10. It should be noted that the invention may dispose one single flexible circuit board 16a or 16b at one side within the casing 10, i.e. the invention is not limited to dispose the flexible circuit boards 16a, 16b at the same time. Needless to say, the invention may dispose more than two flexible circuit boards in the casing 10 according to practical applications.

As mentioned in the above, the middle portions 164 of the flexible circuit boards 16a, 16b may break easily as the first end portion 160 and/or the second end portion 162 is pulled by an external force. Accordingly, when the detachable component 14 is detached from the casing 10 and the first end portion 160 and/or the second end portion 162 of the flexible circuit board 16a is pulled by an external force, the middle portion 164 of the flexible circuit board 16a breaks, such that the first detection loop 166 is cut off. Similarly, when the detachable component 14 is detached from the casing 10 and the first end portion 160 and/or the second end portion 162 of the flexible circuit board 16b is pulled by an external force, the middle portion 164 of the flexible circuit board 16b breaks, such that the first detection loop 166 is cut off. In this embodiment, the processor 120 may keep detecting whether the first detection loop 166 is cut off. When the processor 120 detects that the first detection loop 166 is cut off, the processor erases the data stored in the memory 122. Accordingly, when the electronic device 1 is stolen, the invention can prevent the data stored in the electronic device 1 from being stolen effectively.

Figure 7:
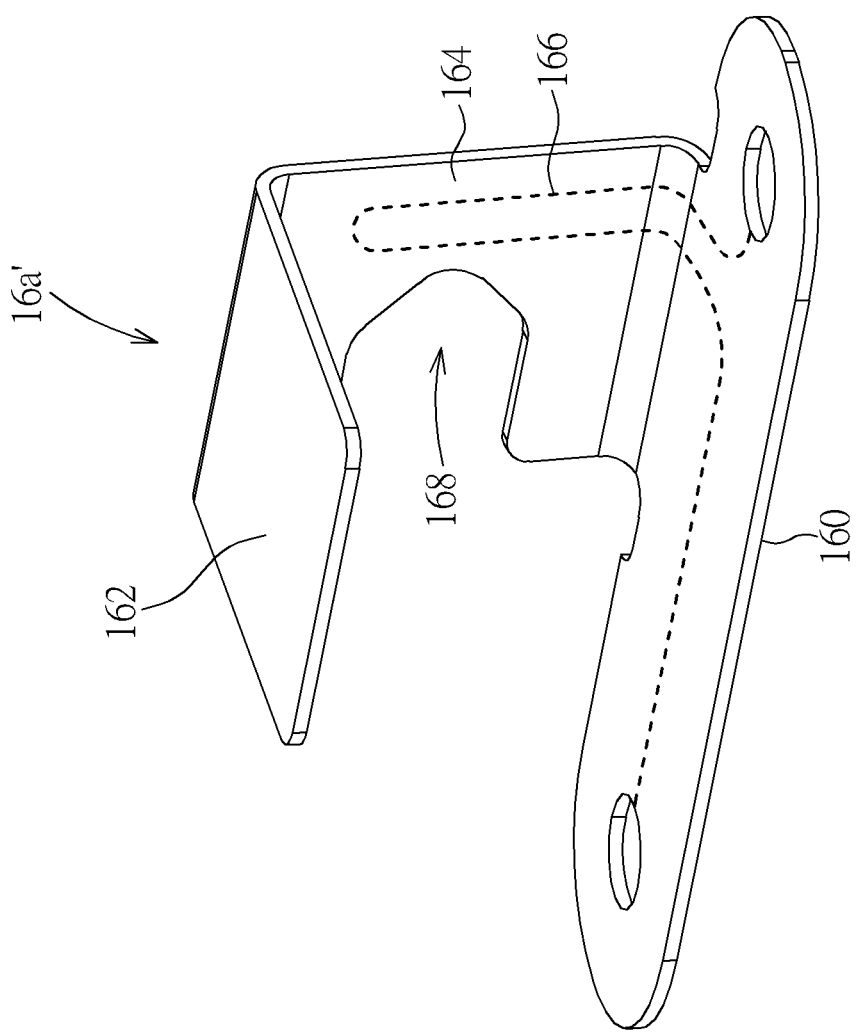
FIG. 7 is a perspective view illustrating a flexible circuit board according to another embodiment of the invention.

Referring to FIG. 7, FIG. 7 is a perspective view illustrating a flexible circuit board 16a' according to another embodiment of the invention. The main difference between the flexible circuit board 16a' and the aforesaid flexible circuit board 16a is that there is only one hole 168 formed on one side of the middle portion 164 of the flexible circuit board 16a', such that the first end portion 160, the second end portion 162 and the middle portion 164 form a U-shape, as shown in FIG. 7. It should be noted that the structural design of the flexible circuit board 16a' may also be applied to the aforesaid flexible circuit board 16b and the repeated explanation will not be depicted herein again.

Figure 8:
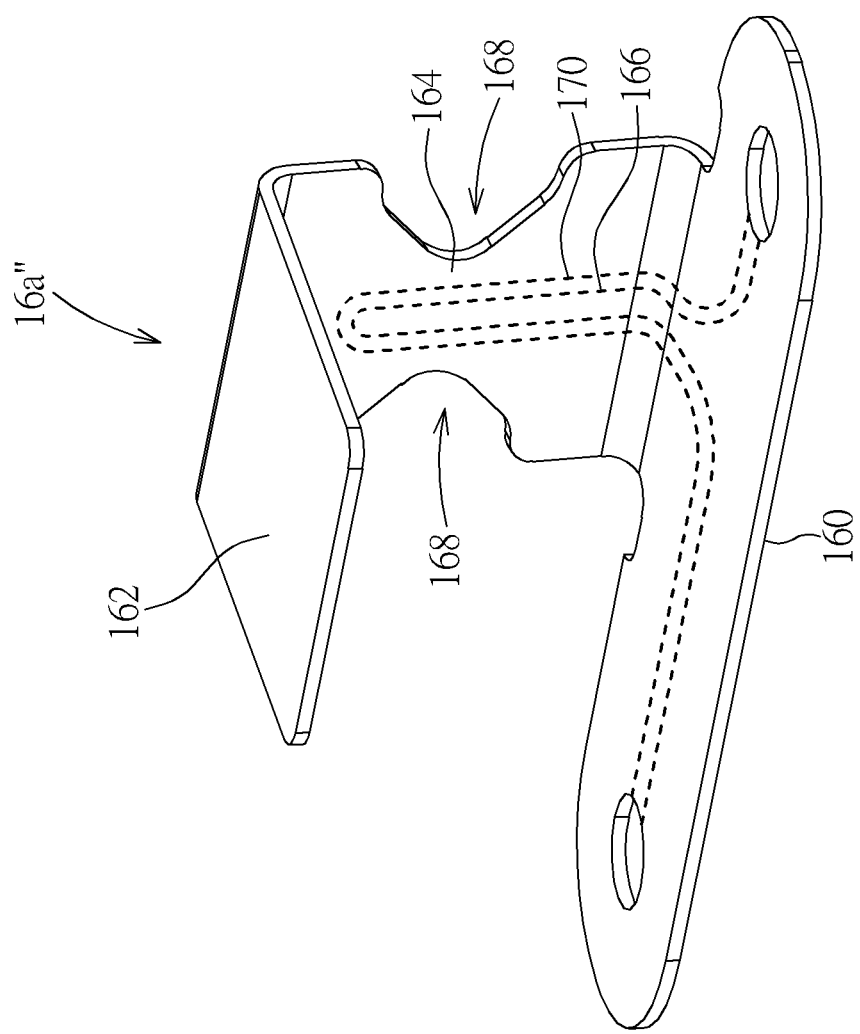
FIG. 8 is a perspective view illustrating a flexible circuit board according to another embodiment of the invention.

Referring to FIG. 8, FIG. 8 is a perspective view illustrating a flexible circuit board 16a" according to another embodiment of the invention. The main difference between the flexible circuit board 16a" and the aforesaid flexible circuit board 16a is that the flexible circuit board 16a" further comprises a second detection loop 170, wherein the second detection loop 170 is also disposed at the first end portion 160 and the middle portion 164, as shown in FIG. 8. Preferably, the width of the middle portion 164 may be between 1 mm and 2 mm, such that the wide of the middle portion 164 is enough for accommodating the first detection loop 166 and the second detection loop 170, and the middle portion 164 may break easily as the first end portion 160 and/or the second end portion 162 is pulled by an external force.

The aforesaid flexible circuit board 16a may be replaced by the flexible circuit board 16a" shown in FIG. 8. Thus, when the detachable component 14 is detached from the casing 10, the middle portion 164 of the flexible circuit board 16a" breaks, such that at least one of the first detection loop 166 and the second detection loop 170 is cut off. When at least one of the first detection loop 166 and the second detection loop 170 is cut off, the processor 120 erases the data stored in the memory 122. Accordingly, when one of the first detection loop 166 and the second detection loop 170 fails, the invention can still prevent the data stored in the electronic device 1 from being stolen by the other one of the first detection loop 166 and the second detection loop 170. It should be noted that the structural design of the flexible circuit board 16a" may also be applied to the aforesaid flexible circuit board 16b and the repeated explanation will not be depicted herein again.

As mentioned in the above, the invention connects the first end portion of the flexible circuit board to the main circuit board and fixes the second end portion of the flexible circuit board on the detachable component. When the detachable component is detached from the casing, the middle portion of the flexible circuit board breaks, such that the first detection loop is cut off. At this time, the processor erases the data stored in the memory. Accordingly, when the electronic device is stolen, the invention can prevent the data stored in the electronic device from being stolen effectively. In addition to the first detection loop, the flexible circuit board of the invention may further comprise the second detection loop. Accordingly, when one of the first detection loop and the second detection loop fails, the invention can still prevent the data stored in the electronic device from being stolen by the other one of the first detection loop and the second detection loop.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An electronic device comprising:
a casing;
a main circuit board disposed in the casing, the main circuit board comprising a processor and a memory, the memory storing data;
a detachable component disposed in the casing; and
a flexible circuit board comprising a first end portion, a second end portion, a middle portion and a first detection loop, the middle portion being located between the first end portion and the second end portion, the first detection loop being disposed at the first end portion and the middle portion, the first end portion being electrically connected to the main circuit board, the second end portion being fixed on the detachable component;

wherein when the detachable component is detached from the casing, the middle portion breaks, such that the first detection loop is cut off; when the first detection loop is cut off, the processor erases the data stored in the memory.

2. The electronic device of claim 1, wherein a width of the middle portion is smaller than a width of the first end portion and smaller than a width of the second end portion.

3. The electronic device of claim 2, wherein the width of the middle portion is between 1 mm and 2 mm.

4. The electronic device of claim 1, wherein the first end portion, the second end portion and the middle portion form an H-shape or a U-shape.

5. The electronic device of claim 1, wherein at least one hole is formed on at least one side of the middle portion.

6. The electronic device of claim 1, wherein the flexible circuit board further comprises a second detection loop, the second detection loop is disposed at the first end portion and the middle portion; when the detachable component is detached from the casing, the middle portion breaks, such that at least one of the first detection loop and the second detection loop is cut off; when at least one of the first detection loop and the second detection loop is cut off, the processor erases the data stored in the memory.

7. The electronic device of claim 1, wherein the detachable component is a touch panel.

* * * * *